United States Patent [19]

Juniper

[11] 4,099,127
[45] Jul. 4, 1978

[54] AUDIO FREQUENCY AUTOMATIC MUTING ARRANGEMENT

[75] Inventor: Derek Stanley Juniper, Chelmsford, England

[73] Assignee: Elliott Brothers (London) Limited, England

[21] Appl. No.: 746,118

[22] Filed: Nov. 30, 1976

[30] Foreign Application Priority Data

Dec. 29, 1975 [GB] United Kingdom ............... 53043/75

[51] Int. Cl.² .............................................. H04B 1/10
[52] U.S. Cl. ..................................... 325/478; 325/348
[58] Field of Search ............... 325/348, 402, 456, 478, 325/476

[56] References Cited

U.S. PATENT DOCUMENTS

| 2,802,939 | 8/1957 | Klehfoth | 325/478 |
| 3,011,052 | 11/1961 | Busby | 325/478 |
| 3,568,068 | 3/1971 | Russell, Jr. et al. | 325/478 |
| 3,805,166 | 4/1974 | Paredes | 325/478 |

FOREIGN PATENT DOCUMENTS 1,427,029  3/1974  United Kingdom ................. 325/478

Primary Examiner—Robert L. Griffin
Assistant Examiner—Jin F. Ng

[57] ABSTRACT

An audio frequency muting arrangement includes one circuit for detecting intelligence signals in a received audio frequency signal, and a further circuit for detecting noise signals, so as to compare the levels of the noise and intelligence signals and to control a muting switch in dependence thereon. The invention is applicable to noisy environments, e.g. aircraft, in which a threshold circuit is used to track the ambient noise level. Particular signal detection circuits are described.

5 Claims, 1 Drawing Figure

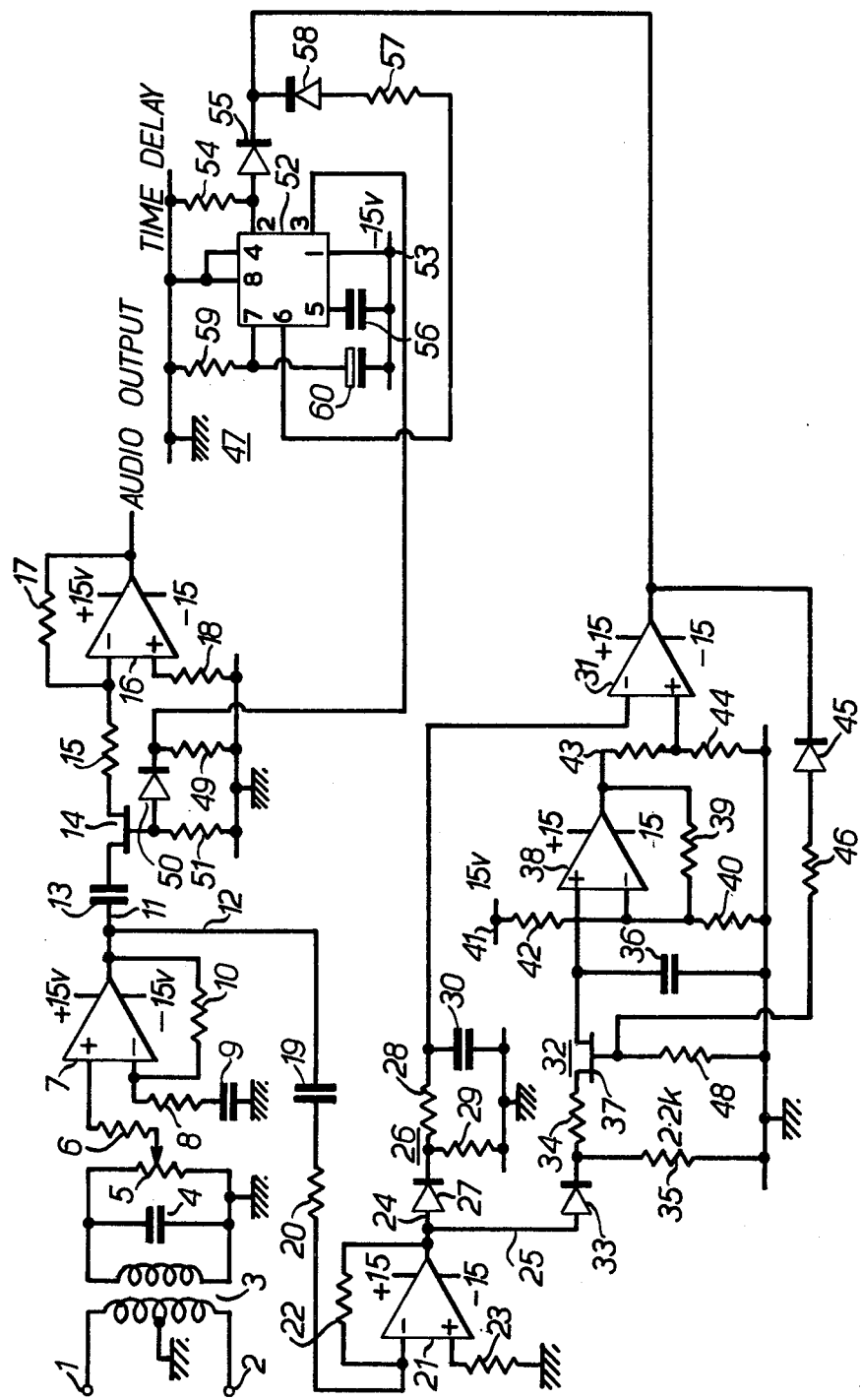

AUDIO FREQUENCY AUTOMATIC MUTING ARRANGEMENT

This invention relates to audio frequency automatic muting arrangements.

Particularly for speech communication, it is often required to provide a muting switch between an audio frequency source, such as a microphone, and utilisation means which muting switch is automatically closed (i.e. rendered conductive) when the level of the speech intelligence signals exceeds the ambient noise by a predetermined extent. It is, of course, possible merely to subject the entire audio signal (intelligence signals with noise) to a set threshold which is sufficiently high to discriminate against noise. However, in noisy ambient conditions such as exist in the cockpit of an aircraft, it is very desirable that this threshold level "tracks" the ambient noise level so that an operator does not have to speak loudly even when the ambient noise level is low.

The present invention seeks to provide an improved automatic audio frequency muting arrangement in which the threshold level is provided to follow the ambient noise level.

According to this invention, an automatic audio frequency muting arrangement comprises a muting switch in a path for audio frequencies, means for detecting intelligence signals in a received audio frequency signal, means for detecting noise signals in said audio frequency signal, means for comparing the levels of said detected intelligence and noise signals and means for utilising the result of such comparison to control said muting switch and wherein said detecting means for intelligence signals comprises a capacitive time constant circuit which is of relatively short time constant, said detecting means for noise signals comprises a capacitive time constant circuit of relatively long time constant and means are provided for isolating the time constant capacitor of said noise signal detecting means from the input thereof during times at which intelligence signals are present in said received audio frequency signal.

Preferably said last mentioned means comprises an electronic switch between the input of said noise signal detector and the time constant capacitor therein, which time constant switch is controlled by the output of a comparator arranged to compare a signal derived from the level of charge in said time constant capacitor with a signal derived from the level of charge of the time constant capacitor in said intelligence signal detecting means, which comparator is also arranged to control the operation of said muting switch.

Preferably means are provided for subjecting the input from said noise signal detector time constant capacitor to said comparator to an off-set such that in the total absence of a received audio frequency signal, or in the presence of an intelligence signal which does not exceed the level of said off-set, said comparator provides an output control signal which holds said muting switch open and said time constant switch closed.

Preferably again between said comparator and the control input for said muting switch, a time delay arrangement is provided such that said muting switch is opened a predetermined short period of time following the cessation of intelligence signals in order, in the case of speech signals, to take into account natural pauses.

The invention is illustrated in and further described with reference to the accompanying drawing which is a circuit diagram of one audio frequency automatic muting arrangement in accordance with the present invention.

Referring to the drawing, microphone input terminals 1, 2 are provided to receive audio signals from a microphone. In this case the microphone input is 300 ohms and the terminals 1 and 2 are connected to the primary of a transformer 3 of turns ratio 1 to 5.66. Across the secondary of transformer 3 is a smoothing capacitor 4, of 6800 $p^F$, and a 10K ohms linear potentiometer 5. The sliding contact of potentiometer 5 is connected via a 10K ohms resistor 6 to the non-inverting input terminal of an operational amplifier 7 which consists of one half of a standard linear integrated circuit type 558. The inverting input terminal of operational amplifier 7 is connected to earth via a 10K ohms resistor 8 and a 0.1 /uF capacitor 9. A feedback path is also provided from the output of amplifier 7 via a 270K ohms resistor 10 to the inverting input terminal of amplifier 7. Output from amplifier 7 is divided into two paths 11 and 12. Path 11 extends via an 8 /uF capacitor 13, an FET (field effect transistor) switch 14 and a 3.3K ohms resistor 15 to the inverting input of a further operational amplifier 16. Operational amplifier 16 is again formed of one half of a standard linear integrated circuit type 558. A feedback path is provided from the output of operational amplifier 16, via a 12K ohms resistor 17 to its inverting input terminal. The non-inverting input terminal of the operational amplifier 16 is connected to earth via a 3.3K ohms resistor 18. When switch 14 is closed (i.e. rendered conductive), the output from operational amplifier 16 comprises audio signals generated by the microphone connected to the input terminals 1 and 2. Switch 14 is closed in dependence upon the signal to noise ratio of the signals generated by the microphone connected to terminals 1 and 2 as now to be described.

Path 12 extends via an 8 /uF capacitor 19 and a 1K ohm resistor 20 to the inverting input terminal of another operational amplifier 21 which again consists of one half of a standard linear integrated circuit type 558. The output of amplifier 21 is connected to its inverting input terminal via a 10K ohms resistor 22 and the non-inverting terminal of the amplifier 21 is connected to earth via a 1K ohm resistor 23. The function of amplifier 21 is to provide additional amplification for the total audio signal applied to the terminals 1 and 2, both noise and intelligence signals.

The output of amplifier 21 is divided into two paths 24 and 25. Path 24 is connected to an intelligence signal level detector 26 which is of short time constant. Signal level detector 26 consists of a rectifier 27, a series 100K ohms resistor 28, a parallel 2.2K ohms resistor 29 and a parallel 0.1/uF capacitor 30. The output of the intelligence signal level detector 26 is connected to one input terminal of a comparator 31, which again is provided by one half of a standard linear integrated circuit type 558.

Path 25 is connected to an ambient noise level detector 32 of long time constant. Ambient noise level detector 32 consists of a rectifier 33, a series 100K ohms resistor 34, a parallel 2.2K ohms resistor 35 and a parallel 1.2 /uF electrolytic capacitor 36. The parallel capacitor 36 is provided to be isolated from the input of the ambient noise level detector 32 by an FET switch 37.

The output of the ambient noise level detector 32 is applied to the non-inverting terminal of an off-set comparator 38, which again is formed by one half of a standard linear integrated circuit type 558. A 10K ohms resistor 39 is provided in a feedback path from the output of the off-set comparator 38 to its inverting input, which inverting input is also connected to earth via a 10K ohms resistor 40 and to a 15 volt bias supply 41, via a 1.5M ohm resistor 42. The output of the off-set comparator 38 is applied to a potential divider consisting of two 5.6K ohms resistors 43 and 44, the mid-point of which is connected to the other input terminal of the comparator 31. Off-set comparator 38 provides an off-set bias of 0.1 volts.

The output of comparator 31 is connected both to control isolating switch 37 via a rectifier 45 and a 10K ohms resistor 46 and, via a time delay circuit 47, to control muting switch 14. Control signals from resistor 46 are applied between the gate electrode of FET switch 32 and a 100K ohms resistor 48 the other terminal of which is earthed. Control signals from the time delay circuit 47 are connected to earth via a 10K ohms resistor 49 and via a rectifier 50 to a point between the gate electrode of FET switch 14 and a 10K ohms resistor 51 the other terminal of which is connected to earth.

Time delay circuit 47 consists of a standard integrated circuit type 555, referenced 52. Terminal coded 1 of integrated circuit 52 is connected to a −15 volt bias supply 53. Terminal coded 2 of integrated circuit 52 is connected to earth via 68K ohms resistor 54 and to receive signals from the output of comparator 31 via a rectifier 55. Terminal coded 3 of integrated circuit 52 comprises the output terminal and is connected to supply control signals to muting switch 14, as aforementioned. Terminals coded 4 and 8 of integrated circuit 52 are connected to earth. Terminal coded 5 of integrated circuit 52 is connected to the bias supply 53 via a 0.014 /uF capacitor 56. Terminal coded 6 of integrated circuit 52 is connected via a 1K ohm resistor 57 and a rectifier 58 to the output of comparator 31. Terminal coded 7 of the integrated circuit 52 is connected to earth via a 56K ohms resistor 59 and to the bias supply 53 via a 8 /uF electrolytic capacitor 60.

In operation with no input signals applied to terminals 1 and 2, no output is produced by signal level detector 26 or by ambient noise level detector 32. Off-set comparator 38 produces an output which is applied to comparator 31, which, because this derives no input signal from signal level detector 26, provides an output which holds time constant switch 37 closed (i.e. conductive) and muting switch 14 open (i.e. non-conductive).

With a constant level of noise input, both the signal time constant capacitor 30 and the noise level time constant capacitor 36 will charge to the same level, although at different rates. In this circumstance off-set comparator 38 will again act to cause comparator 31 to hold switch 14 open and switch 37 closed.

With audio intelligence signals applied, the peak signals will cause the signal level time constant capacitor 30 to charge more rapidly than the noise level time constant capacitor 36 and, if the rise is sufficient to overcome the off-set provided by off-set comparator 38, the output of comparator 31 will change so as to trigger time delay device 52 so as to close muting switch 14, thus permitting the signals applied to input terminals 1 and 2 to proceed to the input of amplifier 16, and open time constant switch 37. Opening switch 37 acts to isolate the noise level time constant capacitor 36. By removing detected input from the noise time constant capacitor 36, the charge is stored for a period dependent upon the capacity of the capacitor and the shunt impedance of the off-set comparator 38.

Thus when the circuit determines that an audio intelligence signal is present, the isolated charge in noise time constant capacitor 36 represents the long term average of the input noise. In the absence of intelligence signals the noise time constant capacitor 36 is connected in the long time constant circuit 32 and follows the longer term variation in input noise. By this means the charge in the noise level time constant capacitor 36 represents more closely than would otherwise be the case, the mean noise level since it is disconnected during the presence of speech signals.

The function of time delay circuit 47 is to delay for a predetermined short period the opening of muting switch 14, following cessation of speech, in order to avoid the circuit attempting to respond to mere natural breaks in the speech signals.

I claim:

1. An automatic audio frequency muting arrangement comprising a muting switch in a path for an audio frequency signal, first signal level detector means including a first capacitor which is charged to values determined by the instantaneous amplitudes of intelligence and noise signals in said audio frequency signal with sufficient rapidity as to respond to the instantaneous amplitudes of said intelligence signals at a first predetermined rate, second signal level detector means including a second capacitor which is charged to values determined by the instantaneous amplitudes of intelligence and noise signals with sufficient slowness as to respond to the instantaneous amplitudes of said intelligence signals at a second predetermined rate which is slower than said first predetermined rate, means for comparing the detected levels of said first and second level detector means, means for utilizing the result of such comparison to control said muting switch and isolating means coupled to the output of said comparing means for isolating said second capacitor during times at which intelligence signals are present in said audio frequency signal.

2. An arrangement as claimed in claim 1 and wherein said isolating means comprises an electronic switch.

3. An arrangement as claimed in claim 2 further comprises means for subjecting the output of said second capacitor to an off-set bias such that in the total absence of a received audio frequency signal, or in the presence of an intelligence signal which does not exceed the level of said off-set bias, said comparing means provides an output control signal which holds said muting switch open and said electronic switch closed.

4. An arrangement as claimed in claim 2 and further comprises a time delay arrangement coupled between said comparing means and the input of said muting switch, for opening said muting switch after a predetermined short period of time following the cessation of intelligence signals.

5. An automatic audio frequency muting arrangement comprising, in combination:
   input means for receiving intelligence signals and ambient noise signals and having an output;
   amplifier means for providing an audio output and a normally open muting switch selectively connecting the output of said input means to said amplifier means; and
   control means connected to the output of said input means for closing said muting switch when the level of said intelligence signals exceeds the level of said ambient noise signals by a predetermined amount, whereby said control means tracks the level of ambient noise, said control means comprising first signal level detector means including a first capacitor which is charged to values determined by the instantaneous amplitudes of said intelligence and noise signals with sufficient rapidity as to respond to the instantaneous amplitudes of said intelligence signals at a first predetermined rate, second signal level detector means including a second capacitor which is charged to values determined by the instantaneous amplitudes of said intelligence and noise signals with sufficient slowness as to respond to the instantaneous amplitudes of said intelligence signals at a second predetermined rate which is slower than said first predetermined rate, biasing means connected to said second capacitor for producing an output which is equal to the charge level in said second capacitor plus a predetermined excess, isolating means for isolating said second capacitor from the output of said input means, and comparator means connected to said first capacitor and to the output of said biasing means for closing said muting switch and for actuating said isolating means when the charge level on said first capacitor reaches a level exceeding the output of said biasing means.

* * * * *